(12) United States Patent
Mahle

(10) Patent No.: US 7,078,271 B2
(45) Date of Patent: Jul. 18, 2006

(54) LEADFRAME-TO-PLASTIC LOCK FOR IC PACKAGE

(75) Inventor: Richard L. Mahle, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/802,068

(22) Filed: Mar. 15, 2004

(65) Prior Publication Data

US 2004/0175864 A1 Sep. 9, 2004

Related U.S. Application Data

(62) Division of application No. 10/252,217, filed on Sep. 23, 2002, now Pat. No. 6,794,738.

(51) Int. Cl.
*H01L 21/50* (2006.01)
(52) U.S. Cl. .................. 438/123; 438/124; 438/121
(58) Field of Classification Search ................ 438/123, 438/111–112, 127
See application file for complete search history.

(56) References Cited

U.S. PATENT DOCUMENTS

| 4,862,246 | A  | * | 8/1989  | Masuda et al. | 257/666 |
| 6,483,178 | B1 | * | 11/2002 | Chuang        | 257/672 |
| 6,576,989 | B1 | * | 6/2003  | Hong et al.   | 257/678 |

* cited by examiner

*Primary Examiner*—Luan Thai
(74) *Attorney, Agent, or Firm*—Yingsheng Tung; Wade James Brady, III; Frederick J. Telecky, Jr.

(57) ABSTRACT

Disclosed is a method of making a mold lock for bonding leadframe-to-plastic in an IC package. Steps include providing niches from opposing sides of the leadframe. The opposing niches are arranged such that an aperture and a mechanical key are formed within the leadframe material by the partial intersection of the niches. The key is encapsulated with mold compound to form a lock. An IC package mold lock in a leadframe is also disclosed, the lock having an aperture, a key, and mold compound encapsulating the key. Additionally, an IC package employing the leadframe-to-plastic lock is disclosed.

7 Claims, 4 Drawing Sheets

LEADFRAME-TO-PLASTIC LOCK FOR IC PACKAGE

TECHNICAL FIELD

This application claims priority under 35 USC § 120 of provisional application Ser. No. 10/252,217, filed Sep. 23, 2002 now U.S. Pat No. 6,794,738. The present application is a divisional of the above identified application. The invention relates to an IC package mold lock and methods for making the same. More particularly, the invention relates to leadframe-to-plastic lock structures and methods for use in IC packages.

BACKGROUND OF THE INVENTION

It is well known to encapsulate IC devices in packages in order to protect the device and to provide connective leads for coupling the terminals of the IC to the outside world, such as a PC board.

Problems are encountered with packaged IC devices used in the arts both in the manufacturing stages and in testing and use. Among the problems, some of the most common and debilitating are the separation of layers of devices, lead fingers pulling out of the package, and open or short circuits caused by separation of materials or the ingress of moisture between separated materials. Attempts to improve the bond between leadframes and package materials have been made using stamped or etched vias in the leadframes, which are then filled with encapsulant. Although somewhat resistant to sheering, these efforts have enjoyed limited success.

Improved leadframe-to-plastic IC package locks would be useful and advantageous in the arts. Such leadframe locks would provide increased reistance to sheering and separating forces providing a more secure bond.

SUMMARY OF THE INVENTION

In carrying out the principles of the present invention, in accordance with an embodiment thereof, a method of making an IC package mold lock includes steps of providing a first niche in a leadframe surface and providing an opposing niche in an opposing leadframe surface. The first niche and opposing niche partially intersect, defining an aperture in the leadframe. The niches are arranged such that a key is defined by the intersecting and nonintersecting portions of the niches. The key is encapsulated with mold compound to form a mold lock.

According to one aspect of the invention, an IC package mold lock device includes a leadframe having at least one aperture. The aperture has a key with mold compound disposed in the aperture and encapsulating the key forming a mold lock.

According to another aspect of the invention, an IC package mold lock is provided with a key having a first niche in a surface of the leadframe axially unaligned with a partially intersecting opposing niche in an opposing surface of the leadframe. The niches are of approximately identical same size and shape, the key structure resulting from their nonalignment.

According to yet another aspect of the invention, an IC package mold lock is provided with a key including a first niche in a surface of the leadframe axially aligned with a partially intersecting opposing niche in an opposing surface of the leadframe. The niches are aligned, but not identically shaped, the key structure resulting from their shape difference.

According to still another aspect of the invention, an IC package has a leadframe having a die pad and multiple of lead fingers. A number of apertures in the leadframe are provided, at least one of which has a key. Mold compound encapsulates the key to form a mold lock.

The invention provides technical advantages including but not limited to providing an IC package mold lock ensuring a secure mechanical bond between the leadframe and encapsulant of an IC package. The invention may be used advantageously to provide improved bonds for lead fingers or die pads in DIP, QFN, SOP, or other semiconductor device packages. These and other features, advantages, and benefits of the present invention will become apparent to one of ordinary skill in the art upon careful consideration of the detailed description of representative embodiments of the invention in connection with the accompanying drawings.

BRIEF DESCRIPTION OF THE DRAWINGS

The present invention will be more clearly understood from consideration of the following detailed description and drawings in which:

FIG. 2A is a sectional view of a portion of a leadframe prior to masking and etching;

FIG. 2B is a sectional view of the portion of a leadframe of FIG. 2A having niches in one surface;

FIG. 2C is a sectional view of the portion of the leadframe of FIG. 1 taken along line C—C showing niches in one surface and opposing niches in an opposing surface;

References in the detailed description correspond to like references in the figures unless otherwise noted. Like numerals refer to like parts throughout the various figures. Descriptive and directional terms used in the written description such as top, bottom, left, right, etc., refer to the drawings themselves as laid out on the paper and not to physical limitations of the invention unless specifically noted. The drawings are not to scale and some features of embodiments shown and discussed are simplified or exaggerated for illustrating the principles, features, and advantages of the invention.

DETAILED DESCRIPTION OF PREFERRED EMBODIMENTS

Figure 1:
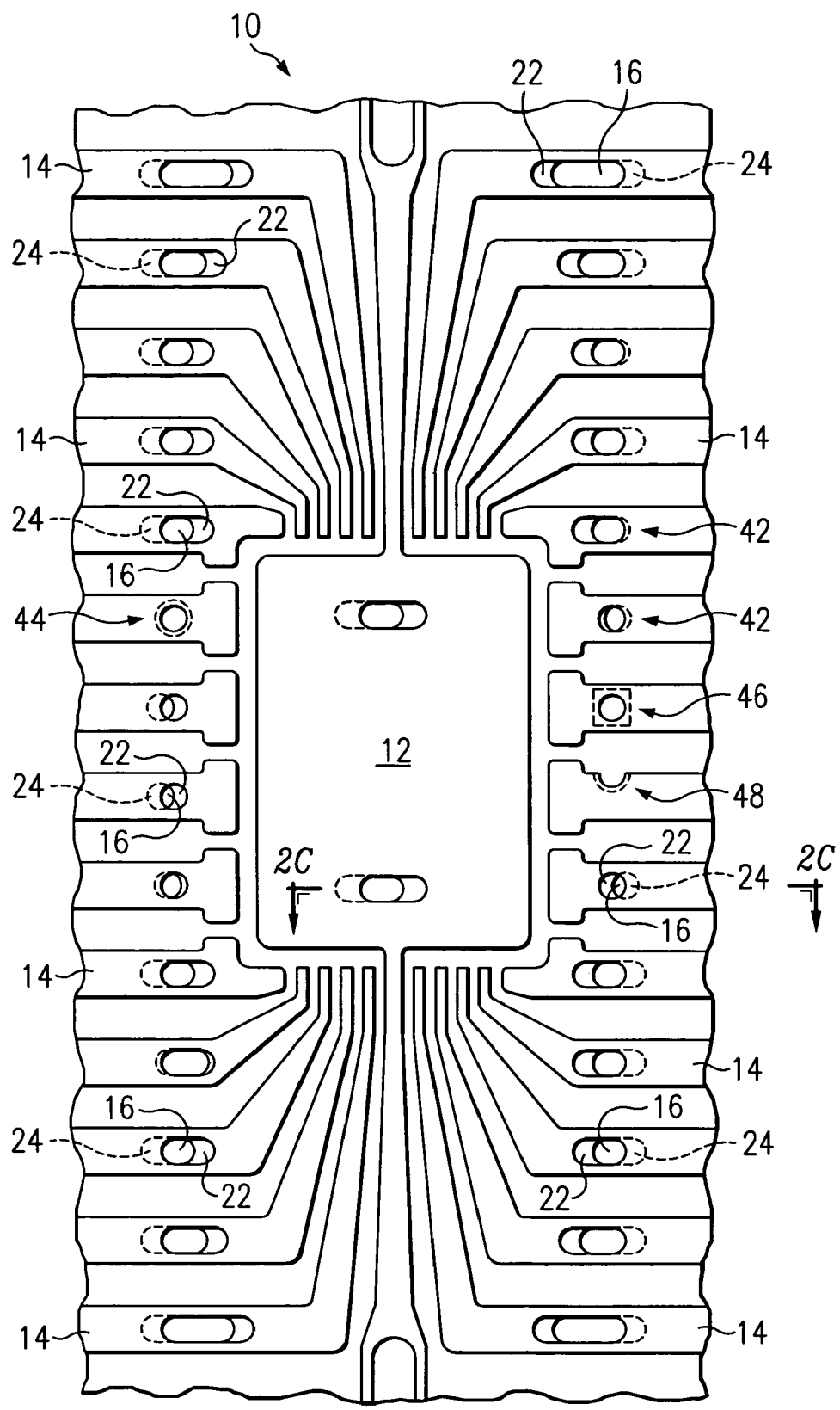
FIG. 1 is a top view of an example of an IC leadframe demonstrating mold locks according to preferred embodiments of the invention.

In general, the invention provides an IC package leadframe mold lock and methods for making the same. Representatively illustrated in FIG. 1 is a top view of an example of a leadframe 10 according to a preferred embodiment of the invention. The leadframe 10 has a die pad 12 and numerous lead fingers 14. According to this exemplary embodiment both the die pad 12 and each of the lead fingers 14 have perforating apertures 16. It should be understood that the invention may alternatively be implemented with various combinations of apertures 16 in either the die pad 12, some or all of the lead fingers 14, or both, as further described.

Figure 2A:
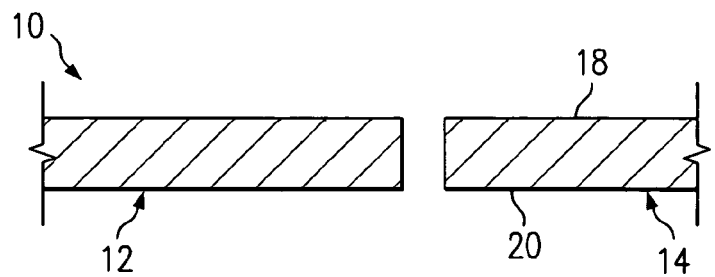
FIGS. 2A through 2C are sectional views of a portion of a leadframe as shown in the example of FIG. 1 illustrating various stages in a preferred method of making an IC package mold lock according to the invention.
Figure 2B:
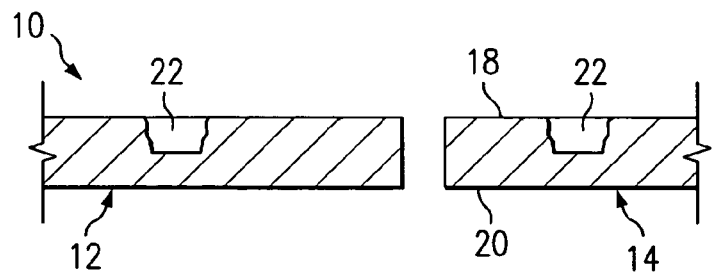
Figure 2C:
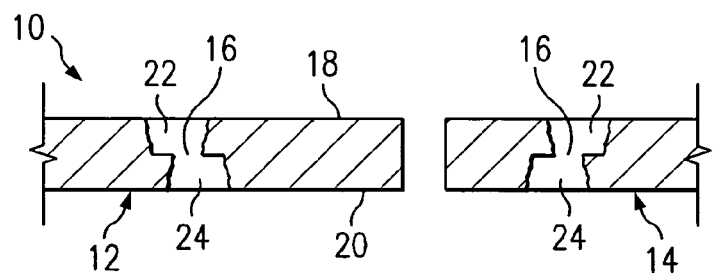

As may be seen in FIG. 2C, which is a sectional view of the portion of the lead frame 10 of FIG. 1 taken along line C—C, the apertures 16 are located within the leadframe material and neither at the top 18 nor at the bottom 20 surfaces of the leadframe 10. Preferably the apertures are formed by partially etching opposed niches 22, 24 in the leadframe surfaces 18, 20 from either side. Understanding of the leadframe 10 shown in FIG. 1 and FIG. 2C and methods of manufacturing the leadframe lock of the invention will be enhanced with further reference to FIGS. 2A through 2C.

In FIG. 2A, a section of the leadframe 10 is shown. A first surface 18 has an opposing surface 20. Using appropriate masking and etching techniques known in the arts, first niches 22 as illustrated in the section view of FIG. 2B are etched into the first surface 18 of the leadframe 10. Opposing niches 24 are also masked and etched into the opposing surface 20 of the leadframe 10 as depicted in FIG. 2C. Preferably, the first niches 22 and opposing niches 24 may be etched at the same time. The depth of the first niches 22 and opposing niches 24 may be varied without departure from the invention as long as an aperture 16 is formed within the leadframe 10. For example, each niche may extend approximately halfway through the leadframe from either surface. Alternatively, one niche may extend approximately one-quarter of the way through and the opposing niche approximately three-quarters through the leadframe, or halfway and three-quarters respectively. The exact configuration of the niches, techniques of their formation, and their depth are not crucial to the concept of the invention as long as an aperture 16 is provided by aligning or partially aligning the opposing niches and etching or stamping to depths sufficient to cause the opposing niches to intersect.

Figure 3:
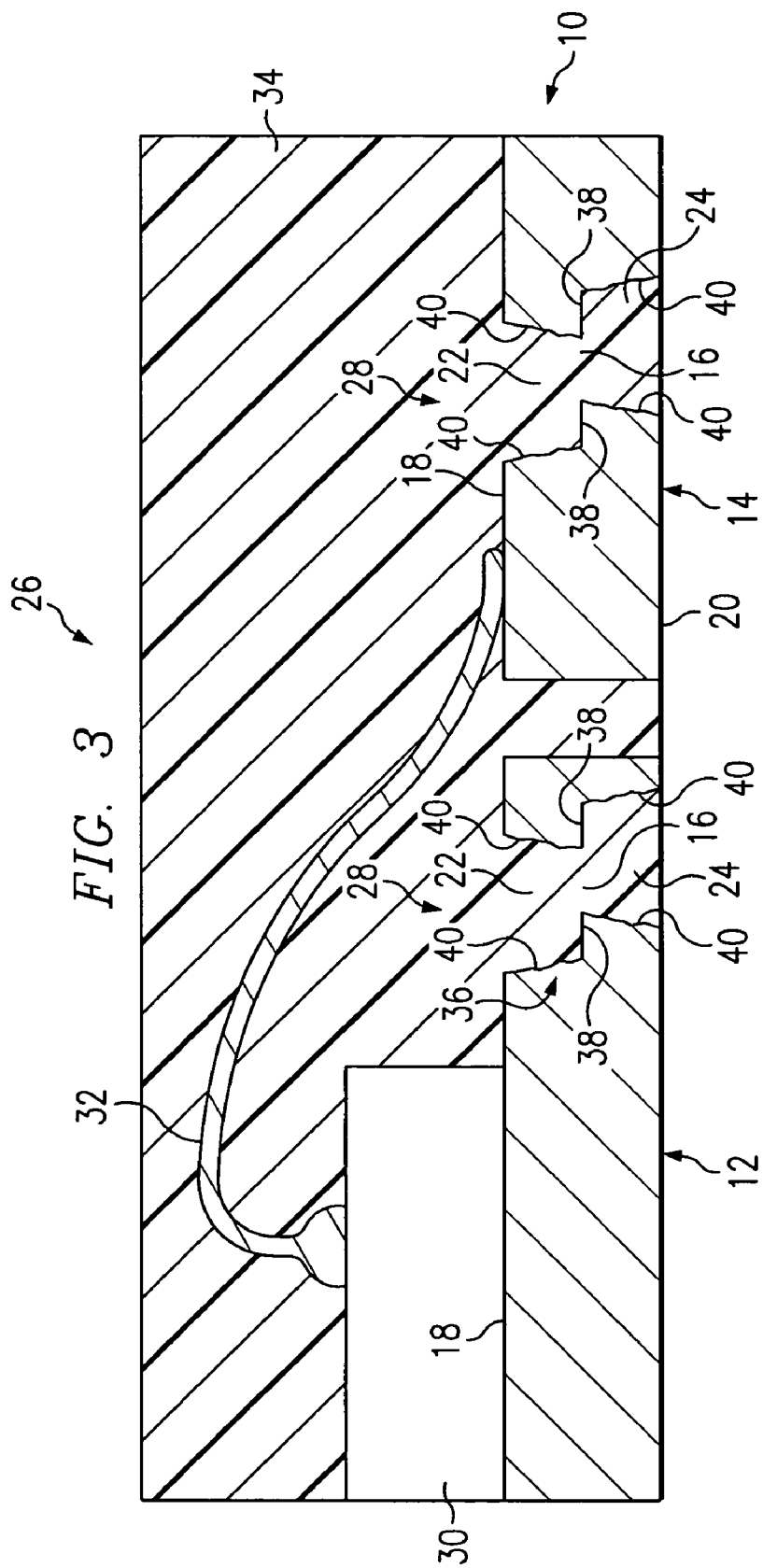
FIG. 3 is a sectional view of the portion of a leadframe as in the example of FIG. 2C incorporated into a QFN IC package according to the invention.

Now referring primarily to FIG. 3 a section view of an example of a completed IC package 26 with a preferred embodiment of a leadframe lock 28 of the invention is shown. The leadframe 10 and niches 22, 24 have a semiconductor die 30 attached to the die pad 12 and a wire 32 bonded to the die 30 and to the lead finger 18 in a manner known in the arts. The package 26 has been completed by the addition of encapsulating dielectric material 34, typically a form of hard-curing plastic or epoxy resin, generally referred to as plastic or mold compound. The mold compound 34 encapsulates keys 36 (further discussed below) of the leadframe apertures 16 as shown. It should be appreciated that the niches 22, 24 need not necessarily be completely filled with mold compound 34, so long as the key 36 is encapsulated, providing a mechanical bond.

Figure 4:
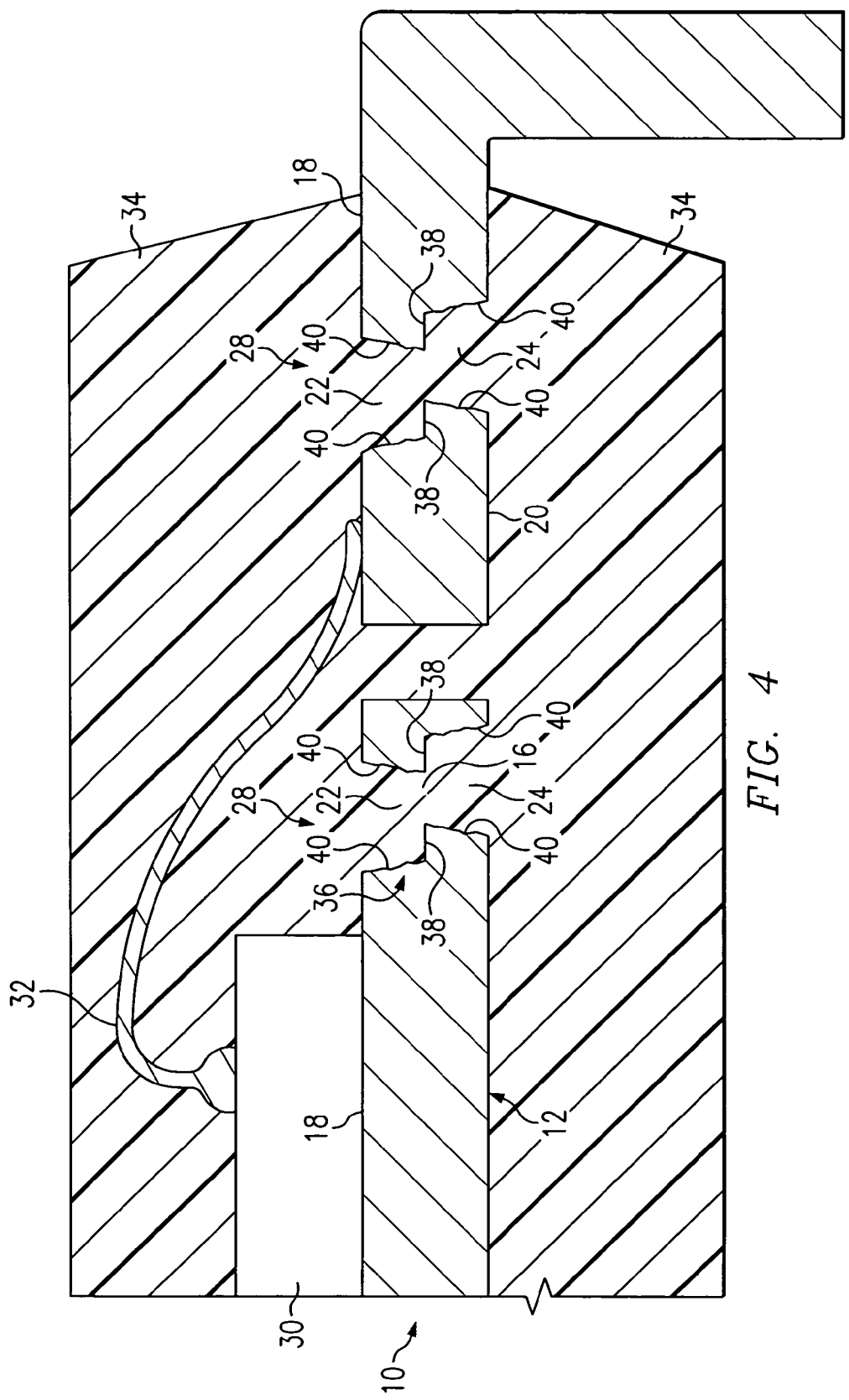
FIG. 4 is a sectional view of the portion of a leadframe as in the example of FIG. 2C incorporated into a DIP IC package according to the invention.

FIG. 4 illustrates an example of an alternative embodiment of the invention in a DIP package. The mold lock 28 is provided as described in combination with a DIP package made according to methods known in the arts. The invention may also be used with other packages using a metallic leadframe or die pad, e.g.: SIP, SOIC, SSOP, TSSOP, TVSOP.

It should be understood that the aperture 16 completely perforates the leadframe 10 by the intersection of the niches 22, 24, preferably etched from the opposing leadframe 10 surfaces 18, 20. The aperture 16 itself may be any size or shape found desirable for the particular manufacturing process, tooling, or application. The aperture 16 provides fluid communication for uncured mold compound 34 to flow between the opposing niches 22, 24. Thus, the non-intersecting niche surfaces each form one or more generally horizontal step 38 between the approximately vertical niche walls 40, the horizontal steps 38 being adjacent to the aperture 16. These step surfaces 38 adjoined by an aperture 16 are denominated "keys" 36 herein, referring to the mechanical key structure 36 formed by the junction of the two opposed niches 22, 24, regardless of shape or size. This mechanical key structure 36, when encapsulated by mold compound 34, form a lead lock 28 providing a secure bond enhancing resistance to sheer and the separation of the layers of the IC package 26.

It will be understood by those skilled in the arts that the relative size and shape of the opposing niches is not an essential feature of the invention. For example, the niches may be substantially identical in size and shape so long as they are not perfectly aligned along their central axes. Again referring to FIG. 1, examples of cylindrical and oval niches of the same size, but offset from one another are shown at 42. Alternatively, the niches may be axially aligned, but of different size or shape, e.g.; as shown at 44, a relatively larger cylindrical niche may be axially aligned with an opposing relatively smaller cylindrical niche, or a cylindrical niche may be used in opposing axial alignment with a rectangular niche 46. Of course, the lock structure may alternatively be located at an edge portion of the lead finger or die pad as shown at 48. Many alternative niche configurations and arrangements may be used without departure from the invention.

Figure 5:
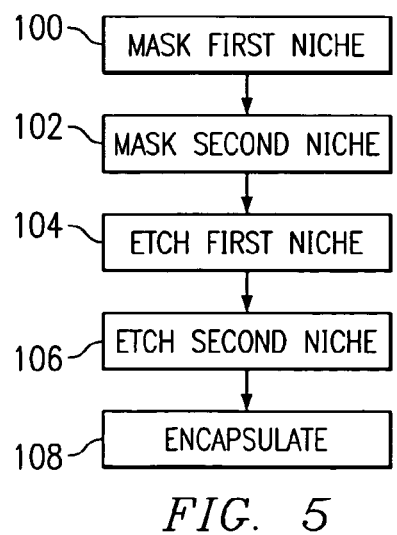
FIG. 5 is a process flow diagram illustrating steps according to one example of a preferred method of the invention.

FIG. 5 is a process flow diagram illustrating steps in a preferred method of the invention. As shown in steps 100, and 102, a first niche and opposing second niche are masked at the desired location on the opposing leadframe surfaces. The first niche and second niche are etched, steps 104 and 106 respectively, using processes known in the arts such that the aperture and key structure is formed. The package key structure is encapsulated 108 to form a secure leadframe mold lock. Of course many variations are possible and some of the steps shown may be performed simultaneously according to known methods of manufacture. For example, the masking steps, or etching steps, may be combined. Additional steps commonly used in the manufacture of IC packages may also be used in implementing the invention. For example, a stamping step may be substituted for one etching step and associated masking step. It will be appreciated by those skilled in the arts that the invention may be used with various types of device packages, such as DIP, SIP, SOIC, SSOP, TSSOP, TVSOP, and QFN packages, for example.

Thus, the invention provides leadframe locks, IC packages, and methods used in their construction, providing secure mechanical bonds resistant to separation and sheer. Numerous technical advantages are provided by the invention, including but not limited to improved package strength, resilience, longevity, manufacturability, and reliability. While the invention has been described with reference to certain illustrative embodiments, the description of the methods, systems, and devices described are not intended to be construed in a limiting sense. Various modifications and combinations of the illustrative embodiments as well as other advantages and embodiments of the invention will be apparent to persons skilled in the art upon reference to the description and claims.

I claim:

1. A method of making an IC package mold lock comprising the steps of:
   providing a first niche in a leadframe surface;
   providing an opposing niche in an opposing leadframe surface, the opposing niche partially intersecting with the first niche with a step having an abrupt intersection portion such that an aperture in the leadframe is defined by the intersecting portions, and such that a key is defined by the nonintersecting portions; and
   encapsulating the key with mold compound to form a mold lock.

2. The method of claim 1 wherein the encapsulating step further comprises filling the first niche, opposing niche, and aperture with mold compound.

3. The method of claim 1 wherein the providing steps further comprise the steps of masking and etching the leadframe surfaces.

4. The method of claim 1 wherein the step of providing an opposing niche further comprises the step of providing an opposing niche axially unaligned with a first niche of approximately identical same size and shape.

5. The method of claim 1 wherein the step of providing an opposing niche further comprises the step of providing an opposing niche axially aligned with a first niche of nonidentical size and shape.

6. The method of claim 1 wherein the leadframe surfaces further comprise lead finger surfaces.

7. The method of claim 1 wherein the leadframe surfaces further comprise die pad surfaces.

* * * * *